(12) United States Patent
Frohberg et al.

(10) Patent No.: US 9,006,114 B2
(45) Date of Patent: Apr. 14, 2015

(54) METHOD FOR SELECTIVELY REMOVING A SPACER IN A DUAL STRESS LINER APPROACH

(75) Inventors: Kai Frohberg, Niederau (DE); Volker Grimm, Langebrueck (DE); Heike Salz, Radebeul (DE); Heike Berthold, Hirschfeld (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1493 days.

(21) Appl. No.: 12/359,839

(22) Filed: Jan. 26, 2009

(65) Prior Publication Data

US 2009/0273035 A1    Nov. 5, 2009

(30) Foreign Application Priority Data

Apr. 30, 2008   (DE) .................. 10 2008 021 565

(51) Int. Cl.
| | |
|---|---|
| *H01L 21/31* | (2006.01) |
| *H01L 21/8238* | (2006.01) |
| *H01L 29/78* | (2006.01) |
| *H01L 29/66* | (2006.01) |

(52) U.S. Cl.
CPC *H01L 21/823807* (2013.01); *H01L 21/823814* (2013.01); *H01L 21/823864* (2013.01); *H01L 29/665* (2013.01); *H01L 29/6653* (2013.01); *H01L 29/66545* (2013.01); *H01L 29/66636* (2013.01); *H01L 29/7843* (2013.01)

(58) Field of Classification Search
USPC .......................................... 438/783
See application file for complete search history.

(56) References Cited

U.S. PATENT DOCUMENTS

| | | | |
|---|---|---|---|
| 6,255,180 B1 * | 7/2001 | Smith ........................... | 438/301 |
| 7,138,332 B2 * | 11/2006 | Goundar ....................... | 438/624 |
| 2005/0214998 A1 * | 9/2005 | Chen et al. ................... | 438/199 |
| 2006/0199326 A1 | 9/2006 | Zhu et al. ..................... | 438/201 |
| 2007/0108525 A1 * | 5/2007 | Yang et al. .................... | 257/351 |

FOREIGN PATENT DOCUMENTS

DE   10 2005 057 073 A1   5/2007  .......... H01L 21/8238

OTHER PUBLICATIONS

Translation of Official Communication from German Patent Office for German Patent Application No. 10 2008 021 565.1-33 dated Dec. 8, 2008.

* cited by examiner

Primary Examiner — Yu-Hsi D Sun (57) ABSTRACT

By integrating a spacer removal process into the sequence for patterning a first stress-inducing material during a dual stress liner approach, the sidewall spacer structure for one type of transistor may be maintained, without requiring additional lithography steps.

22 Claims, 7 Drawing Sheets

METHOD FOR SELECTIVELY REMOVING A SPACER IN A DUAL STRESS LINER APPROACH

BACKGROUND OF THE INVENTION

1. Field of the Invention

Generally, the present disclosure relates to the field of integrated circuits, and, more particularly, to the manufacture of field effect transistors having a strained channel region caused by a stressed dielectric material formed above the transistor.

2. Description of the Related Art

Integrated circuits typically comprise a large number of circuit elements on a given chip area according to a specified circuit layout, wherein, in complex circuits, the field effect transistor represents one important device component. Generally, a plurality of process technologies are currently practiced, wherein, for complex circuitry based on field effect transistors, such as microprocessors, storage chips and the like, MOS technology is currently one of the most promising approaches due to the superior characteristics in view of operating speed and/or power consumption and/or cost efficiency. During the fabrication of complex integrated circuits using MOS technology, millions of transistors (in CMOS technology, complementary transistors, i.e., N-channel transistors and P-channel transistors) are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, the conductivity of the channel region represents an important factor that substantially affects the performance of the MOS transistors. Thus, the reduction of the channel length, and associated therewith the reduction of the channel resistivity, may be dominant design criteria for accomplishing an increase in the operating speed of integrated circuits.

The shrinkage of the transistor dimensions, however, involves a plurality of issues associated therewith that have to be addressed so as to not unduly offset the advantages obtained by steadily decreasing the channel length of MOS transistors. One problem in this respect is the reduction of the thickness of the gate dielectric layer in order to maintain the desired channel controllability on the basis of increased capacitive coupling. With the thickness of oxide-based gate dielectrics approaching 1.5 nm and less, the further scaling of the channel length may be difficult due to an unacceptable increase of leakage currents through the gate dielectric. For this reason, it has been proposed to enhance device performance of the transistor elements not only by reducing the transistor dimensions but also by increasing the charge carrier mobility in the channel region for a given channel length. One efficient approach in this respect is the modification of the lattice structure in the channel region, for instance by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase in the conductivity for N-type transistors. On the other hand, compressive strain in the channel region may increase the mobility of holes, thereby providing the potential for enhancing the performance of P-type transistors. Consequently, it has been proposed to introduce, for instance, a silicon/germanium layer or a silicon/carbon layer in or near the channel region to create tensile or compressive stress. Although the transistor performance may be considerably enhanced by the introduction of strain-creating layers in or below the channel region, significant efforts have to be made to implement the formation of corresponding strain-inducing layers into the conventional and well-approved CMOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

Therefore, a technique is frequently used that enables the creation of desired stress conditions within the channel region of different transistor elements by modifying the stress characteristics of a material that is closely positioned to the transistor structure in order to allow an efficient stress transfer to the channel region. For example, the spacer typically provided at sidewalls of the gate electrodes and the contact etch stop layer that is formed above the basic transistor structure are promising candidates for creating external stress which may then be transferred into the transistor. The contact etch stop layer used for controlling an etch process designed to form contact openings to the gate, drain and source terminals in an interlayer dielectric material may also be employed for generating a desired type of strain in the channel regions. The effective control of mechanical stress transferred into the channel region, i.e., an effective stress engineering, may be accomplished for different types of transistors by individually adjusting the internal stress level in the contact etch stop layers located above the respective transistor elements so as to position a contact etch layer having an internal compressive stress above a P-channel transistor while positioning a contact etch stop layer having an internal tensile strain above an N-channel transistor, thereby creating compressive and tensile strain, respectively, in the channel regions.

Typically, the contact etch stop layer is formed by plasma enhanced chemical vapor deposition (PECVD) processes above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher compressive stress, while stress levels of 1 GPa and higher may be obtained for tensile-stressed silicon nitride materials, wherein the type and the magnitude of the intrinsic stress may be efficiently adjusted by selecting appropriate deposition parameters. For example, ion bombardment, deposition pressure, substrate temperature, the type of gas components and the like represent suitable parameters that may be used for obtaining the desired intrinsic stress. As explained before, the contact etch stop layer is positioned close to transistor so that the intrinsic stress may be efficiently transferred into the channel region, thereby significantly improving the performance thereof. Moreover, for advanced applications, the strain-inducing contact etch stop layer may be efficiently combined with other strain-inducing mechanisms, such as strained or relaxed semiconductor materials that are incorporated at appropriate transistor areas in order to also create a desired strain in the channel region.

With reference to FIGS. 1a-1d, a corresponding integration scheme, also referred to as a dual stress liner approach, will be described, in which a tensile-stressed dielectric material may be deposited first.

Figure 1A:
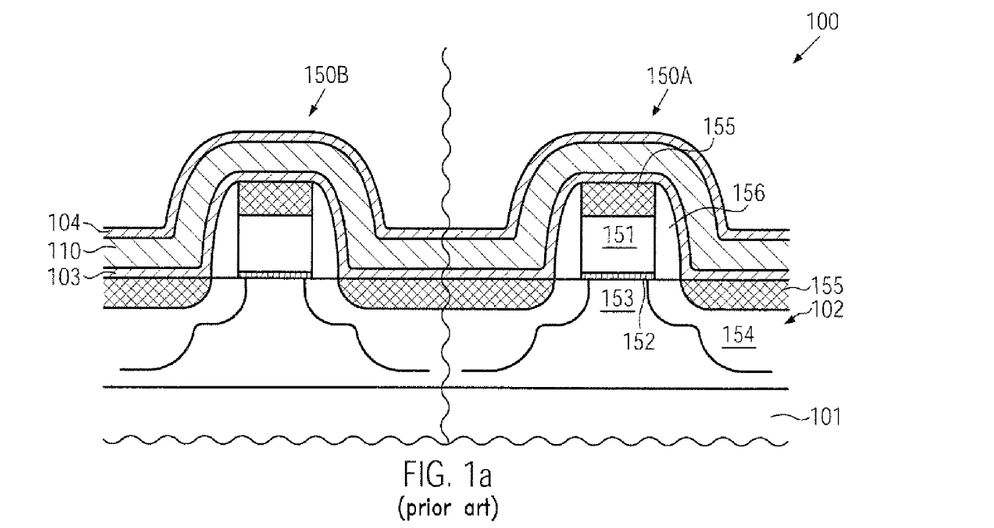
FIGS. 1a-1d schematically illustrate cross-sectional views of a conventional semiconductor device during various manufacturing stages in forming a tensile-stressed dielectric material and a compressively-stressed dielectric material, according to a well-established dual stressed liner approach.

FIG. 1a schematically illustrates a cross-sectional view of a semiconductor device 100 comprising a substrate 101, such as a silicon substrate and the like, above which is formed a silicon semiconductor layer 102. In and above the semiconductor layer 102, an N-channel transistor 150A and a P-channel transistor 150B may be formed. The transistors 150A, 150B may differ in other aspects of their device configuration, in addition to their conductivity type, depending on the overall device requirements. The transistors 150A, 150B may represent a complementary transistor pair or may represent transistor elements which may be located at specific device regions. Although the transistors 150A, 150B may differ in their configuration, for convenience, any such differences are not shown in FIG. 1a. Thus, the transistors 150A, 150B may comprise a gate electrode 151, which may be comprised of polysilicon and the like, depending on the device requirements. Furthermore, a gate insulation layer 152 separates the gate electrode 151 from a channel region 153 which in turn is laterally bordered by drain and source regions 154. Furthermore, metal silicide regions 155 may be provided in the drain and source regions 154 and in the gate electrode 151. As shown, the gate electrode structure may have formed on sidewalls thereof a spacer structure 156, which may be comprised of a plurality of individual spacer elements, possibly in combination with appropriate liner materials, according to well-established spacer concepts. In the manufacturing stage shown in FIG. 1a, the device 100 may further comprise an etch stop layer 103 comprised of, for instance, silicon dioxide, followed by a tensile-stressed contact etch stop layer 110, comprised of the silicon nitride having a high intrinsic tensile stress. Moreover, an etch control layer 104, for instance in the form of silicon dioxide, is formed on the stressed contact etch stop layer 110. Thus, the internal stress of the layer 110 is selected so as to enhance performance of the N-channel transistor 150A, as previously explained.

Typically, the device 100 as shown may be formed on the basis of the following processes. After patterning the gate electrode structure 151 and the gate insulation layer 152, the drain and source regions 154 may be defined, for instance, on the basis of the spacer structure 156, wherein respective individual spacer elements may be provided to act as an efficient implantation mask, depending on the desired lateral and vertical dopant profile for the drain and source regions 154. The dopant within the drain and source regions 154 and implantation-induced damage may be annealed, resulting in activated dopants and a re-crystallized lattice in the drain and source regions 154. Thereafter, the metal silicide regions 155 may be formed on the basis of well-established techniques, for instance including the deposition of an appropriate refractory metal followed by a heat treatment for initiating a chemical reaction. After removal of any non-reactive metal material, the etch stop layer 103 may be deposited, for instance, by PECVD in the form of silicon dioxide having a desired density and thickness as may be desired for a subsequent usage as an etch stop layer, when patterning the contact etch stop layer 110. Next, the layer 110 may be deposited on the basis of appropriately selected deposition parameters, as previously explained, in order to deposit silicon nitride material with reduced density and thus a high internal tensile stress, as may be desired for performance enhancement of the transistor 150a. For instance, during the deposition process, in particular, the degree of ion bombardment may be efficiently used for controlling the magnitude and type of internal stress. Thereafter, the etch control layer 104, for instance in the form of a silicon dioxide material which may have a reduced density, depending on the deposition parameters, is formed, possibly in an in situ process with respect to the layer 110.

Figure 1B:
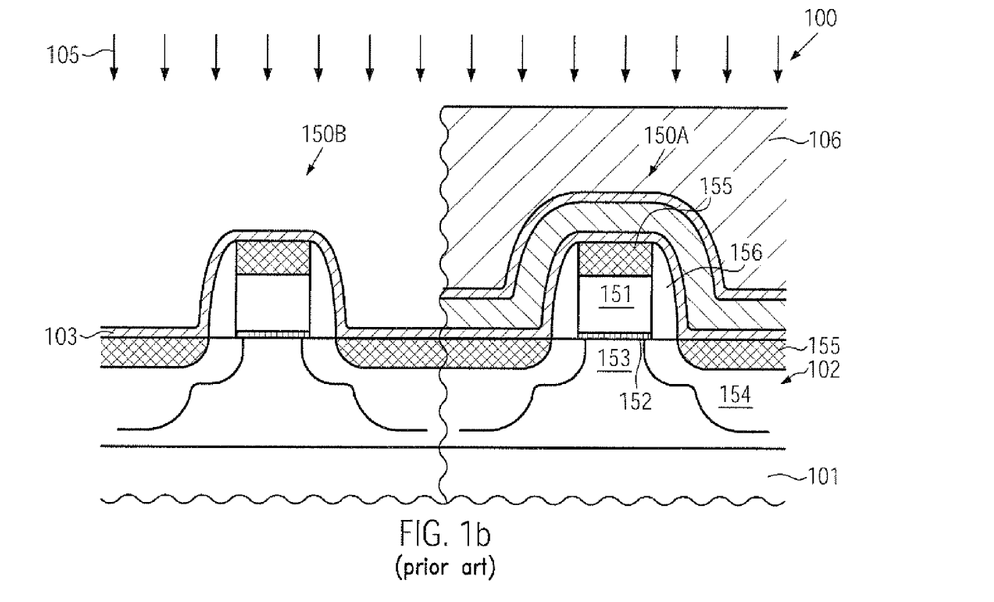

FIG. 1b schematically illustrates the semiconductor device 100 during an etch process 105 which is performed on the basis of a resist mask 106 that covers the N-channel transistor 150A. The resist mask 106 may be formed on the basis of well-established photo-lithography techniques, while, for the etch process 105, a plurality of appropriate etch recipes are available. For instance, the etch control layer 104 may be removed on the basis of any appropriate etch chemistry for etching silicon dioxide material, for instance in the form of a dry or wet chemical etch step. Thereafter, well-established plasma assisted etch recipes may be used for etching the exposed portion of the layer 110 selectively to the etch stop layer 103. For instance, respective etch techniques are well established from conventional spacer techniques and may also be used in this case. The etch stop layer 103 may thus reliably protect sensitive device areas, such as the metal silicide regions 155 in the transistor 150B. Depending on the overall process strategy, the layer 103 may be removed from above the transistor 150B, however on the basis of a less aggressive etch recipe, thereby not unduly affecting the metal silicide regions 155.

Figure 1C:
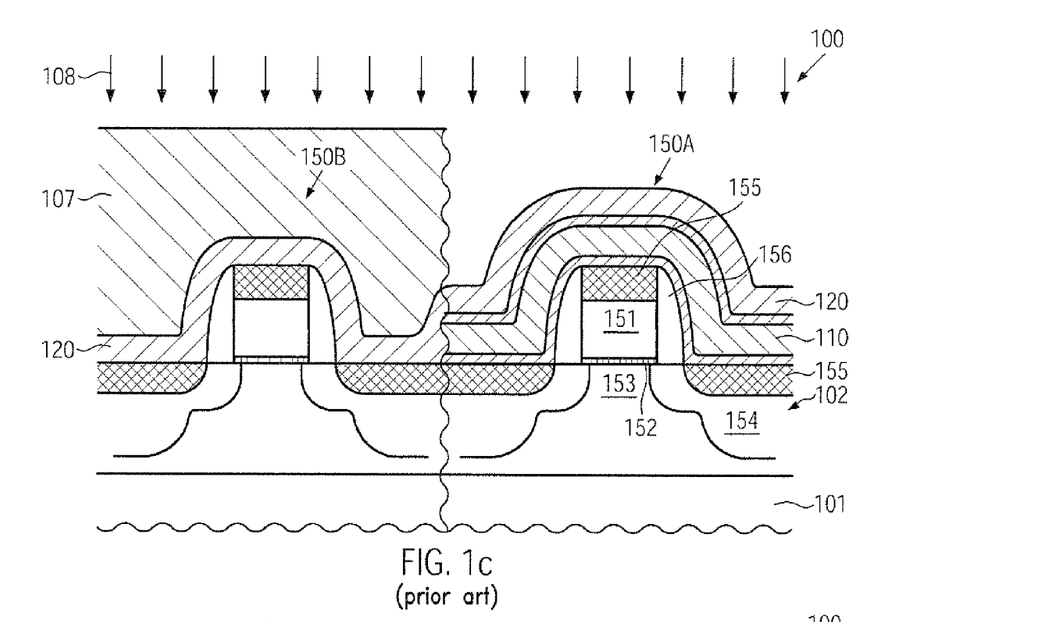

FIG. 1c schematically illustrates the semiconductor device 100 in a further advanced manufacturing stage in which a compressively stressed contact etch stop layer 120 is formed above the transistors 150A, 150B. Additionally, a resist mask 107 protects the transistor 150B during an etch process 108 designed to remove the exposed portion of the compressively stressed layer 120 above the N-channel transistor 150A. The etch process 108 may be carried out on the basis of the etch control layer 104, which may create an appropriate endpoint detection signal, that is, an appropriate spectral intensity of radiation of the gaseous ambient created during the etch process 108, when the etch front encounters the etch control layer 104. After removing the exposed portion of the compressively stressed layer 120 and any residues of the etch control layer 104, the further processing may be continued by depositing an interlayer dielectric material. For this purpose, well-established PECVD techniques on the basis of TEOS (tetra ethyl orthosilicate) are used to provide silicon dioxide material at a high deposition rate with desired chemical and mechanical characteristics. Thus, the transistors 150A, 150B may be enclosed by the silicon dioxide-based material, the surface topography of which may be planarized, for instance, by chemical mechanical polishing (CMP) in which the high mechanical integrity of the silicon dioxide material may result in higher process robustness.

Figure 1D:
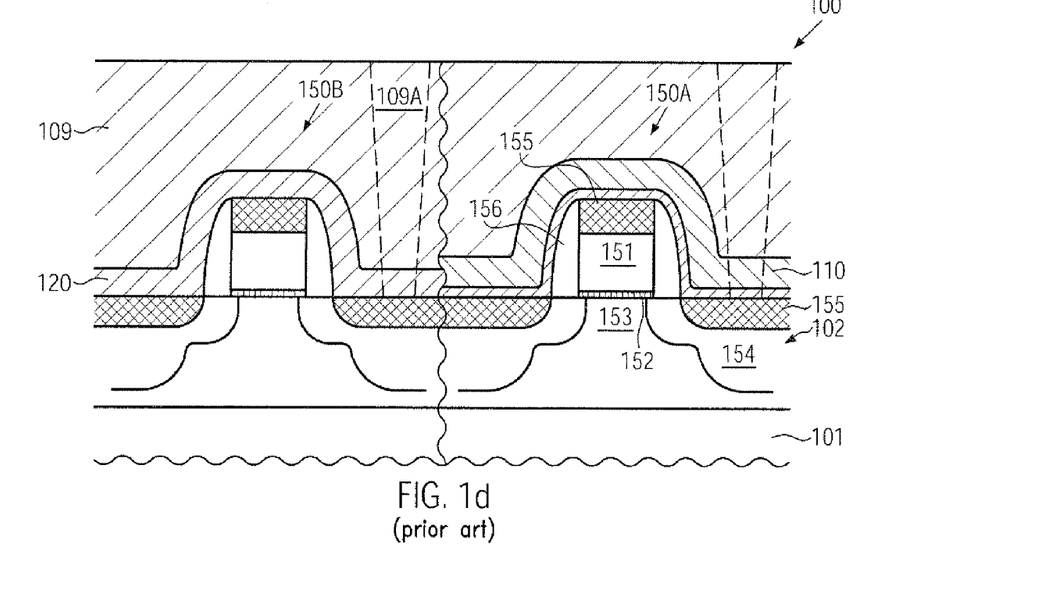

FIG. 1d schematically illustrates the semiconductor device 100 after finishing the above-described process sequence. Hence, the device 100 comprises silicon dioxide material 109 acting as an interlayer dielectric material and having a substantially planar surface configuration. Thereafter, a respective photolithography process may be performed in order to create an etch mask for patterning the interlayer dielectric material 109 to thereby produce respective openings 109A, which are illustrated in dashed lines, and in which a metal material is to be deposited. During a corresponding patterning process, the contact etch stop layers 120, 110 may be used as etch stop materials, which may be opened in a separate etch step so as to finally connect to the drain and source regions 154 and to the gate electrodes 151.

In order to further enhance the overall stress transfer efficiency, it has been proposed to remove the spacer structure 156 after forming the metal silicide regions 155 to position the stressed materials of the layers 110 and 120 closer to the channel regions 153. For this purpose, wet chemical or plasma assisted etch processes may be used and thereafter the above-described dual stress liner approach may be applied. However, in sophisticated semiconductor devices, it is frequently necessary to maintain the spacer structure of one type of transistor due to the specific transistor configuration, while at the same time a desired high strain level is desired in the channel regions. Therefore, after the silicidation process, a lithography step is usually performed to provide a mask for covering the P-channel transistor or the N-channel transistor, depending on the device requirements, and the exposed spacer structure may then be selectively removed. Although a desired gain in performance is achieved with this strategy, the additional lithography process sequence significantly contributes to the overall production costs.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and semiconductor devices in which the stress transfer mechanism of one type of stressed dielectric material may be enhanced by reducing the size of or removing one or more spacer elements of a sidewall spacer structure of one type of transistor, substantially without contributing to increased overall process complexity. To this end, the patterning regime used in a typical dual stress liner approach may be changed so as to reduce the size of the spacer structure or remove one or more spacer elements thereof during an etch sequence for patterning the first dielectric material prior to the deposition of the further stressed dielectric material. By appropriately selecting the sequence for providing the differently stressed dielectric materials, the corresponding dielectric material may be positioned more closely to the channel region for a desired type of transistor so that a high degree of flexibility in designing respective sophisticated semiconductor devices may be achieved, while substantially not contributing to additional production costs. That is, performance of one type of transistor may be significantly increased, while not substantially unduly affecting the other type of transistor, while at the same time, cycle time and thus overall production costs may be comparable with conventional dual stress liner approaches, in which sidewall spacer structures may not be removed or may be removed in a non-selective manner.

One illustrative method disclosed herein comprises forming a dielectric layer stack above a first transistor and a second transistor, wherein the dielectric layer stack comprises a first stress-inducing layer and an etch control layer formed above the first stress-inducing layer. The method further comprises performing an etch sequence for selectively removing a portion of the dielectric layer stack from above the second transistor. Additionally, the method comprises at least reducing a size of a sidewall spacer structure formed on sidewalls of a gate electrode structure of the second transistor, while maintaining a sidewall spacer structure formed on the sidewalls of a gate electrode structure of the first transistor. Additionally, a second stress-inducing layer is formed above the first and the second transistors and, finally, a portion of the second stress-inducing layer is removed from above the first transistor by using the etch control layer as an etch stop material.

A further illustrative method disclosed herein comprises forming a first stress-inducing dielectric layer above a first transistor and a second transistor of a semiconductor device. The method further comprises forming a mask so as to expose the second transistor and cover the first transistor. Furthermore, the first stress-inducing layer is removed from above the second transistor using the mask. The method further comprises at least reducing a size of a sidewall spacer structure of the second transistor on the basis of the mask and selectively forming a second stress-inducing layer above the second transistor.

One illustrative semiconductor device disclosed herein comprises a first transistor that comprises first drain and source regions including first metal silicide regions that are positioned at a first height level, wherein the first transistor further comprises a first gate electrode and a first spacer structure having a first width. The semiconductor device further comprises a second transistor comprising second drain and source regions including second metal silicide regions that are positioned at a second height level that is lower than the first height level. The second transistor further comprises a second gate electrode and a second spacer structure having a second width that is less than the first width. Additionally, the semiconductor device comprises a first stress-inducing layer formed above the first transistor and a second stress-inducing layer formed above the second transistor, wherein the first and the second stress-inducing layers generate a different type of stress.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the subject matter disclosed herein relates to a technique and corresponding semiconductor devices in which a strain-inducing mechanism is provided on the basis of stressed dielectric materials formed above respective transistor elements, wherein the efficiency of one stressed dielectric material may be enhanced by reducing the size of a spacer structure or removing at least one spacer element thereof during a patterning sequence for removing an unwanted portion of the stressed dielectric material that has been deposited first. Consequently, the etch mask, required for patterning the first stressed dielectric material, may also advantageously be employed for reducing the size of the spacer structure or removing at least one spacer element thereof. In some aspects, similar etch steps which may be used for the patterning of the dielectric layer may also be used and appropriately adapted to the etching of the spacer structure. Consequently, by appropriately modifying the etch sequence, depending on the overall structure of the dielectric layer stack, the material of the second dielectric layer may be positioned more closely to the channel region while not requiring an additional lithography step, as may be the case in conventional strategies.

In some illustrative aspects disclosed herein, the first dielectric layer stack may be deposited on the basis of well-established process strategies, for instance by using an etch stop layer followed by the stressed dielectric material and an etch control layer, wherein, during the patterning of the layer stack after removing the etch stop layer, i.e., the last layer of the stack, a further etch step may be added to remove material of the exposed spacer structure to a desired degree, wherein, if required, respective spacer elements may be completely removed selectively to an etch stop liner of the spacer structure. For this purpose, an etch chemistry for a plasma-assisted etch process may be used on the basis of well-established process recipes, wherein a moderately high selectivity with respect to the exposed metal silicide may be used. In other cases, a wet chemical etch process may be used if a sufficiently high selectivity with respect to the metal silicide or at least the semiconductor material of the drain and source regions may be achieved.

In some illustrative embodiments, a certain degree of material erosion in the exposed metal silicide regions may be created, thereby providing a "recessed" configuration by obtaining a lower height level of at least a portion of the metal silicide regions with respect to an interface of the gate insulation layer and the channel region, which may enable an even further enhanced stress transfer mechanism after the deposition of a stressed dielectric material in the recess. That is, upon recessing the metal silicide regions during the size reduction or removal of spacer elements of the spacer structure in total, an increased amount of highly stressed dielectric material may be positioned in the vicinity of the channel region and in particular at a height level that is lower compared to conventional semiconductor devices, so that the corresponding stressed material may act more directly on the channel region.

In other illustrative embodiments, the stress transfer mechanism for the transistor, for which the sidewall spacer structure is to be maintained, may be enhanced by forming the corresponding stressed dielectric material directly on the metal silicide region without providing an etch stop layer, while, in other cases, when enhanced control of the etch process for patterning the first dielectric layer and removing material of the spacer structure of the other type of transistor is desired, an etch stop layer may be formed with an appropriate high internal stress level. In this case, the etch stop layer may be positioned at any appropriate height level, depending on the overall process strategy.

Figure 2A:
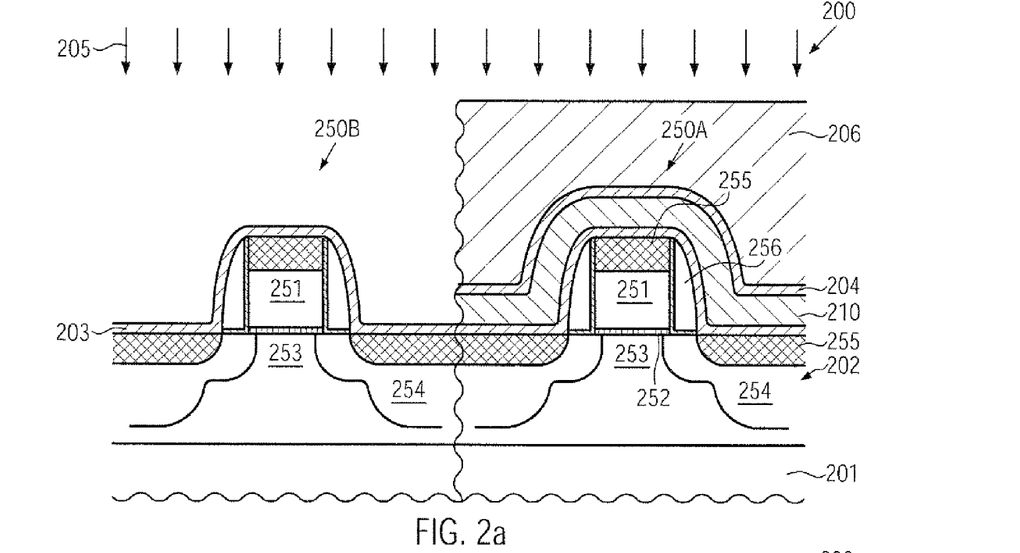
FIGS. 2a-2d schematically illustrate cross-sectional views of a semiconductor device during various manufacturing stages in forming differently stressed dielectric materials, wherein a sidewall spacer structure of one type of transistor may be reduced in size or removed during the patterning of the first stress-inducing dielectric material, according to illustrative embodiments.

FIG. 2a schematically illustrates a cross-sectional view of a semiconductor device 200 comprising a first transistor 250A and a second transistor 250B. Moreover, the semiconductor device 200 may comprise a substrate 201, above which is formed a silicon-based semiconductor layer 202, wherein the semiconductor layer 202 and the substrate 201 may define a "bulk" configuration, in which the semiconductor layer 202 may represent an upper portion of the substantially crystalline substrate 201. In other cases, a silicon-on-insulator (SOI) configuration may be formed by the layer 202 and the substrate 201, when the substrate 201 has formed thereon an insulating buried material (not shown). In other cases, respective SOI areas and bulk areas may be provided on the same substrate at different device regions, such as RAM areas, CPU cores and the like. The first and second transistors 250A, 250B may comprise a gate electrode structure 251, a gate insulation layer 252, a channel region 253, drain and source regions 254, metal silicide regions 255 and a sidewall spacer structure 256. With respect to characteristics of these components, as well as manufacturing techniques for forming the same, substantially the same criteria apply as previously explained with reference to the semiconductor device 100.

Furthermore, as shown, an etch stop layer 203, for instance in the form of a silicon dioxide layer, is formed above the first and second transistors 250A, 250B, while a first stress-inducing layer 210 is selectively formed above the first transistor 250A, followed by an etch control layer 204. For example, the first transistor 250A may represent an N-channel transistor, the performance of which may be enhanced by providing the layer 210 with a high internal tensile stress level, as previously explained. In other illustrative embodiments, the transistor 250A may represent a P-channel transistor and thus the layer 210 may comprise a high compressive stress level. Furthermore, in the manufacturing stage shown, an etch mask 206, such as a resist mask, may be provided and may cover the first transistor 250A, while exposing the second transistor 250B to an etch ambient established for an etch sequence 205.

It should be appreciated that the device 200 as shown may be formed on the basis of substantially the same manufacturing strategies, as previously explained. That is, after forming the etch stop layer 203, the first stress-inducing layer 210 may deposited by plasma-assisted chemical vapor deposition (CVD), thereby controlling process parameters to create a desired high internal stress level. Thereafter, the etch control layer 204 may be deposited or may be formed by surface treatment, such as plasma-based oxidation of the surface area of the material 210 and the like. Forming of the mask 206 may be accomplished on the basis of well-established lithography techniques, and thereafter the etch sequence 205 may be performed, for instance, by using a first etch step for etching through the exposed portion of the etch control layer 204 and subsequently etching through the material of the layer 210, for which well-established plasma-assisted etch recipes are available. In one illustrative embodiment, the etch process for removing material of the layer 210 may be stopped in and on the etch stop layer 203 and subsequently the etch chemistry may be appropriately modified to remove the layer 203. For this purpose, well-established etch recipes may be used.

Figure 2B:
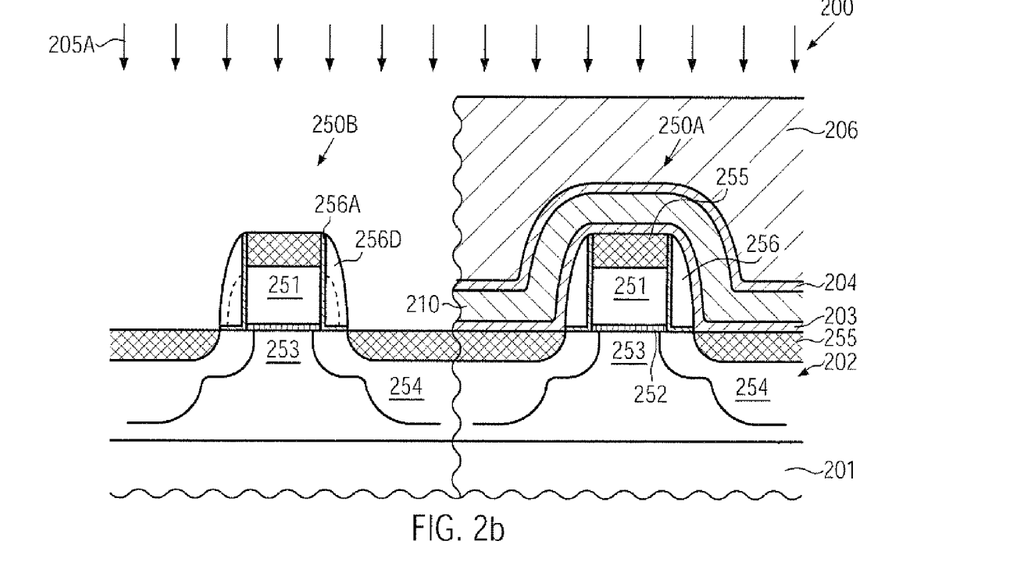

FIG. 2b schematically illustrates the semiconductor device 200 during an advanced phase of the etch sequence 205, in which an etch process 205A is performed involving an etch chemistry having a desired degree of selectivity with respect to a liner material 256A of the spacer structure 256 and also with respect to the metal silicide regions 255. For example, a spacer element 256D may be comprised of silicon nitride and hence well-established process recipes may be used as may, for instance, also be used during the removal of the exposed portion of the layer 210. The corresponding plasma-assisted etch chemistries may also have a moderately pronounced selectivity with respect to the metal silicide regions 255. It should be appreciated, however, that other etch strategies may be used, depending on the material composition of the spacer structure 256. For example, if the spacer structure 256 may comprise a plurality of spacer elements, which may be separated by respective liner materials, the etch chemistry during the etch process 205A may be appropriately changed upon exposure of a respective liner and may then be re-established so as to efficiently etch through the further spacer element, if the removal or reduction in size of two or more spacer elements is desired. In other illustrative embodiments, the etch step 205A may be performed in such a manner that a desired degree of recessing of the metal silicide regions 255 is accomplished, while also a respective reduction in size of the spacer element 256D may be accomplished, however, without completely removing the element 256D, as indicated by the dashed line. In this case, a significant performance enhancement may also be accomplished, since the recessed configuration of the drain and source regions obtained with a high degree of controllability may result in a more efficient stress transfer, while the significantly reduced overall size and width of the spacer element 256D may also allow positioning an increased amount of stressed material more closely to the channel region 253.

Figure 2C:
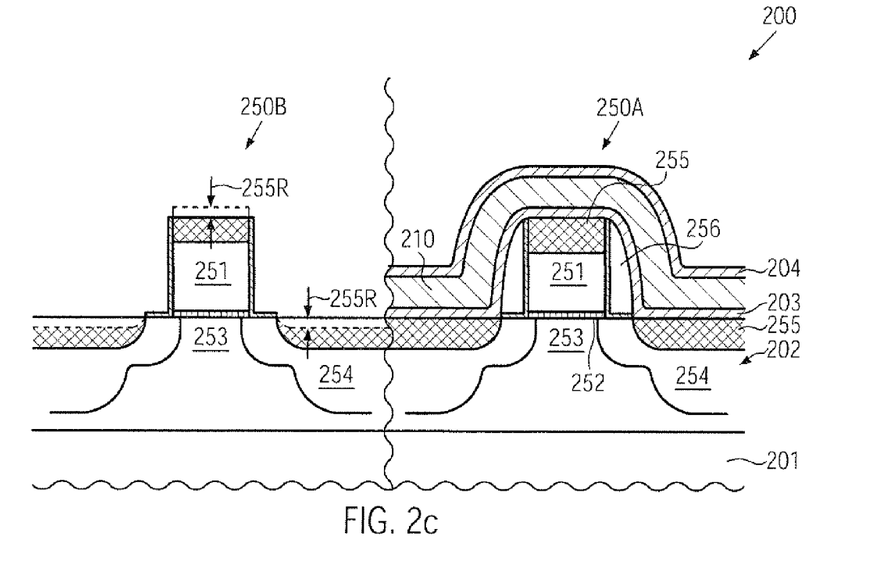

FIG. 2c schematically illustrates the semiconductor device 200 after the etch process 205 and the removal of the etch mask 206. As illustrated, in this embodiment, the spacer element 256D (FIG. 2b), or any further spacer element if provided, may be substantially completely removed, while, in other cases, a portion of the spacer element 256D or one or more spacer elements may be maintained, depending on the overall device requirements. Furthermore, a certain degree of recessing, as indicated by 255R, may be generated, depending on the degree of selectivity of the etch process 205A, as previously explained.

Figure 2D:
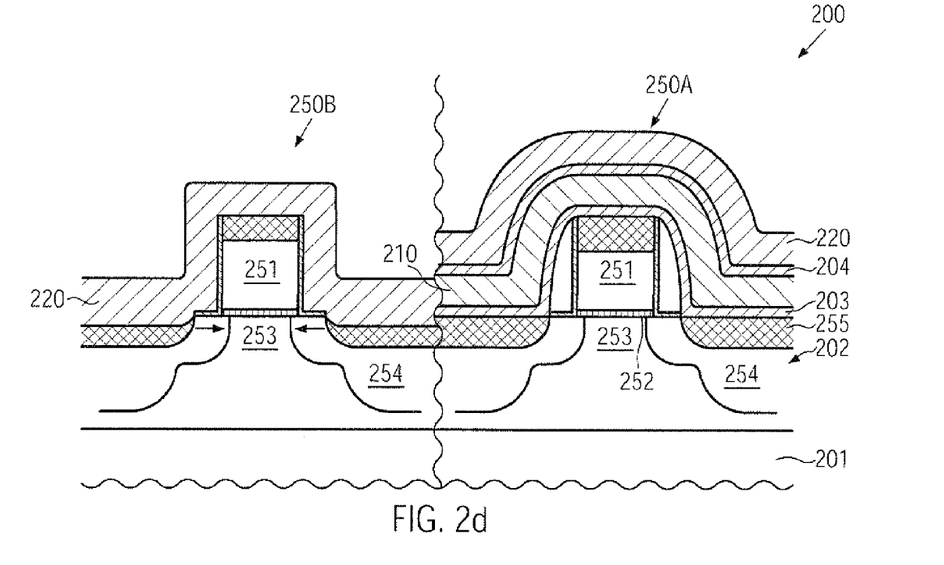

FIG. 2d schematically illustrates the semiconductor device 200 in a further advanced manufacturing stage. As illustrated, a second stress-inducing layer 220 may be formed above the first and the second transistors 250A, 250B, wherein, in the second transistor 250B, an enhanced stress transfer mechanism may be obtained due to the previous etch step 205A for reducing the size of the spacer structure 256 or by substantially completely removing the spacer element 256D. The second stress-inducing layer 220 may be formed on the basis of process techniques as previously described. In one illustrative embodiment, the second transistor 250B may represent a P-channel transistor and hence the layer 220 may be provided with a high internal compressive stress level. In other cases, the layer 220 may represent a layer with high internal tensile stress level, when the transistor 250B is to represent an N-channel transistor. Thus, an increased amount of stressed dielectric material may be positioned more closely to the channel region 253, wherein also, depending on the degree of recessing 255R, a stressed dielectric material may be positioned at a height level that is below a height level defined by the interface between the gate insulation 252 and the channel region 253. It should be appreciated that positional information, such as "above," "below" and the like, are to be understood in relation to the substrate 201. That is, the height level of the surface of the recessed metal silicide regions 255 in the second transistor 250B is lower than the height level of the gate insulation 252 of the second transistor 250B, since a distance of the gate insulation layer 252 to the substrate 201 is greater than a distance of the surface of the recessed metal silicide region 255 of the second transistor 250B.

Thereafter, the further processing may be continued as is described with reference to the semiconductor device 100. That is, a further etch mask may be formed to cover the second transistor 250B while exposing the layer 220 formed above the first transistor 250A. Next, an etch process may be performed using well-established process recipes, wherein the etch control layer 204 may be used for stopping the etch process or at least indicating an appropriate end point of the corresponding etch process. Thereafter, the etch mask may be removed and an interlayer dielectric material may be deposited, which may then be patterned to receive respective contacts, as is also described with reference to the device 100.

Figure 2E:
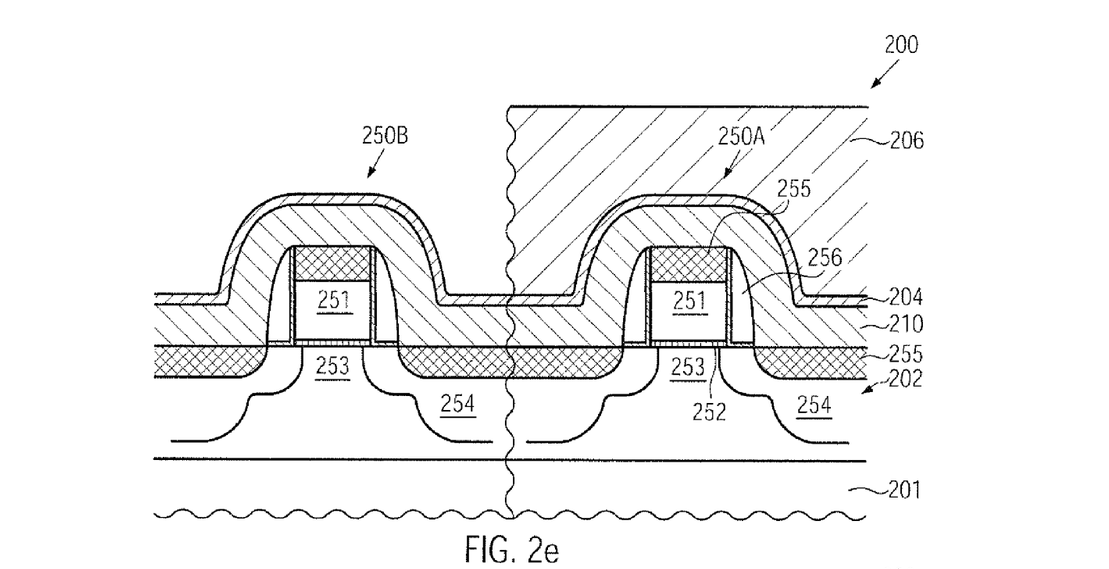
FIGS. 2e-2f schematically illustrate cross-sectional views of the semiconductor device during the patterning of the first dielectric material in combination with the removal of the spacer element, wherein the dielectric material may be directly formed on metal silicide regions, according to further illustrative embodiments.

FIG. 2e schematically illustrates the semiconductor device 200 according to further illustrative embodiments, in which the first stress-inducing layer 210 may be formed directly on the first and the second transistor 250A, 250B. That is, the layer 210 may be formed so as to be in contact with the metal silicide regions 255, thereby providing an enhanced stress transfer mechanism in the first transistor 250A, since the "buffer effect" of the etch stop layer 203 (FIG. 2d) may be avoided.

Figure 2F:
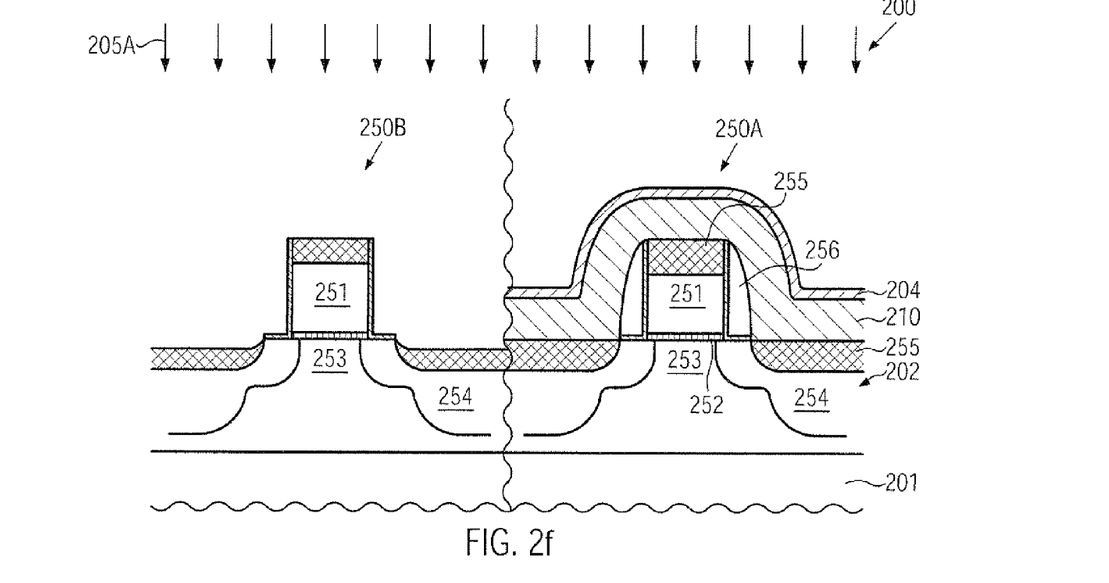

FIG. 2f schematically illustrates the semiconductor device 200 when subjected to the etch step 205A, which may also represent an integral part of the sequence 205, in which, after removing the etch control material 204 from the above the second transistor 250B, a selective etch recipe may be used for commonly removing the material of the layer 210 and of the spacer element 256D. During the etch process 205A, the liner 256A and the metal silicide regions 255 may act as etch stop materials, wherein, as previously explained, a substantially complete removal of the spacer element 256D may not be necessary, if a certain degree of the recessing 255R is to be adjusted. For example, typically, the metal silicide region 255 of the gate electrode 251 may be exposed prior to exposure of the metal silicide regions in the drain and source regions 254, in particular when highly scaled devices are considered, in which, at least in certain device areas, closely spaced transistor elements may be provided, in which the combined layer thickness of the etch control material 204 and the material 210 may be increased in the spaces between two adjacent gate electrode structures. Consequently, an end point detection signal may be detected, in which, upon exposure and reaction with the reactive ambient, respective volatile components of the metal silicide may be observed, wherein an increase of the corresponding signal may indicate the exposure of the drain and source regions 254, so that a desired degree of recessing may be established on the basis of a time-controlled etching after the exposure of the drain and source regions, thereby also reducing the size of the spacer element 256D, however possibly without completely removing the element 256D. Also in this case, a significant enhancement of the overall performance may be obtained, as previously explained. On the other hand, the direct deposition of the layer 210 on the first transistor 250A may result in an increased overall efficiency.

Figure 2G:
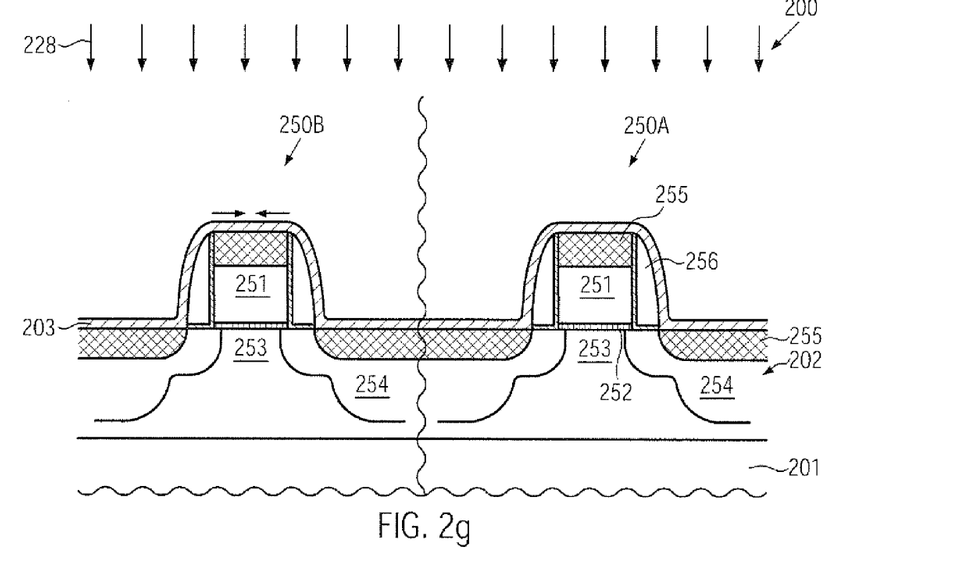
FIGS. 2g-2h schematically illustrate cross-sectional views of the semiconductor device during various manufacturing stages in forming dielectric layer stack using a stressed etch stop layer, wherein a portion of the layer stack may be removed together with at least a portion of a sidewall spacer structure, according to still further illustrative embodiments.

FIG. 2g schematically illustrates the semiconductor device 200 according to further illustrative embodiments, in which it may be assumed that the second transistor 250B may represent a P-channel transistor, thereby requiring a high compressive stress level. As illustrated, the device 200 may be exposed to a deposition ambient 228 for forming the etch stop layer 203 so as to exhibit a high internal compressive stress level. For this purpose, in some illustrative embodiments, a silicon layer may be deposited and may be subsequently oxidized to obtain a desired high internal compressive stress. In still other illustrative embodiments, the etch stop layer 203 may be provided in the form of a nitrogen-containing silicon carbide material, which may also be deposited with high internal compressive stress on the basis of well-established PECVD techniques. Consequently, with respect to a silicon nitride material of high internal compressive stress level, that has to be removed from the first transistor 250A, a certain degree of etch selectivity may be accomplished, thereby enabling an efficient control of the etch sequence 205, as is described with reference to FIGS. 2a-2b.

Figure 2H:
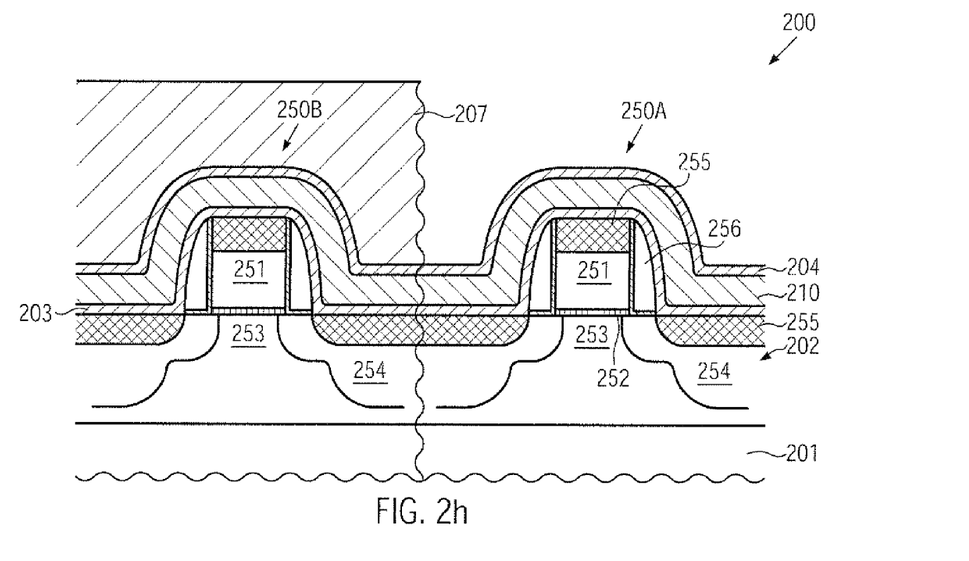

FIG. 2h schematically illustrates the semiconductor device 200 in a further advanced manufacturing stage. As shown, the first stress-inducing layer 210 is formed above the first and second transistors 250A, 250B, followed by the etch control layer 204. In this embodiment, the layer 210 may comprise a high internal compressive stress level corresponding to the stress level of the etch stop layer 203. Furthermore, an etch mask 207 exposes the first transistor 250A, while covering the second transistor 250B. Thereafter, an etch process may be performed to remove the exposed portions of the layers 204 and 210 from above the first transistor 250A by using the etch sequence 205 (FIG. 2a), while the etch stop layer 203 may provide the desired etch stop capabilities, at least to a certain degree, to obtain enhanced uniformity for the subsequent etch process 205A (FIG. 2b). Hence, the spacer structure 256 of the first transistor 250A may be efficiently reduced in size or a respective spacer element thereof may be removed, as previously described. Thereafter, the further processing may be continued with the deposition of the layer 220 (FIG. 2d) having a high tensile stress level, which may act on the first transistor 250A with enhanced efficiency, while also a certain degree of recessing, if desired, may contribute to the overall performance gain. On the other hand, a highly stressed material of internal compressive stress level may be positioned more closely to the channel region of the second transistor 250B by means of the stressed etch stop layer 203.

Figure 2I:
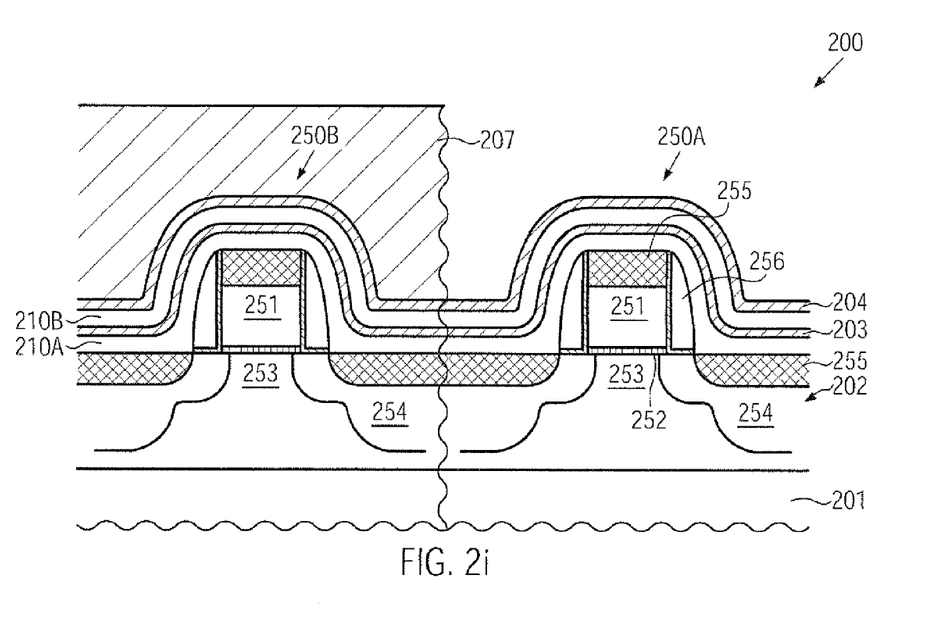
FIG. 2i schematically illustrates a cross-sectional view of a semiconductor device comprising a layer stack with an intermediate etch stop layer, according to still other illustrative embodiments.

FIG. 2i schematically illustrates the semiconductor device 200 according to further illustrative embodiments, in which the etch stop layer 203 may be provided as an inter-mediate layer separating a first sub-layer 210A from a second sub-layer 210B of the first stress-inducing layer 210. For example, if a moderately high degree of process uniformity may be desired with respect to the etch process 205A (FIG. 2f) for removing material of the sidewall spacer structure 256, the sub-layer 210A may be provided with a desired thickness to enhance the overall stress transfer mechanism in the first or second transistor, in which the layers 210A, 210B may provide the desired stress level. In the illustrative embodiment shown, it may be assumed that the layers 210A, 210B may have an appropriate stress level for enhancing performance of the second transistor 250B. Thereafter, the etch stop layer 203 may be formed on the basis of any appropriate material, such as silicon dioxide, nitrogen-containing silicon carbide and the like, wherein the etch stop layer 203 may be provided with the same stress level as the layers 210A, 210B, if compatible with the process for forming the layer 203.

In other cases, the layer 203 may be formed on the basis of any process techniques, since the "buffer effect" at the intermediate position may not unduly affect the overall stress transfer mechanism. Thereafter, the second sub-layer 210B may be deposited on the basis of well-established recipes, followed by the deposition of the etch control layer 204. Thus, upon removing the exposed portion of the layer stack from above the first transistor 250A, the sequence 205 (FIG. 2a) may be used according to well-established techniques, wherein the etch stop layer 203 may then stop the etch process at the height level of the etch stop layer 203. Thereafter, the layer 203 may be removed and subsequently the etch step 205A (FIG. 2b) may start with substantially uniform surface conditions, thereby providing enhanced overall process uniformity, for instance with respect to recessing the metal silicide region 255 and also for removing at least a portion of the spacer structure 256, as previously explained. On the other hand, an enhanced stress transfer mechanism may also be obtained in the second transistor 250B. Thereafter, the further processing may be continued, as previously explained.

As a result, the present disclosure provides techniques and semiconductor devices in which the size reduction or removal of spacer elements of a spacer structure may be selectively accomplished during a patterning sequence for removing an unwanted portion of a first stress-inducing material, thereby avoiding additional lithography steps. Moreover, the stress transfer mechanism for the transistor having the non-removed spacer structure may also be improved by appropriately positioning and/or adjusting the composition of an etch stop layer by providing compressive dielectric material first, and the unwanted portion thereof may then be removed from above N-channel transistors, thereby also enabling the removal or size reduction of the corresponding spacer structure. Similarly, by providing a tensile stressed material first, the spacer structure of a P-channel transistor may be reduced in size or spacer elements thereof may be removed during the patterning of the tensile dielectric material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a dielectric layer stack above a first transistor and a second transistor, said dielectric layer stack comprising a first stress-inducing layer and an etch control layer formed above said first stress-inducing layer;
performing an etch sequence for selectively removing a portion of said dielectric layer stack from above said second transistor;
concurrently recessing metal silicide regions in the second transistor and reducing a size of sidewall spacer structure formed on sidewalls of a gate electrode structure of said second transistor, while maintaining a sidewall spacer structure formed on sidewalls of a gate electrode structure of said first transistor;
forming a second stress-inducing layer above said first and second transistors; and
removing a portion of said second stress-inducing layer from above said first transistor by using said etch control layer as an etch stop material.

2. The method of claim 1, wherein forming said dielectric layer stack comprises forming an etch stop layer and using said etch stop layer for controlling at least one etch process in said etch sequence.

3. The method of claim 2, wherein said etch stop layer is formed prior to forming said first stress-inducing layer.

4. The method of claim 2, wherein said etch stop layer has an internal compressive stress level.

5. The method of claim 4, wherein said etch stop layer is comprised of nitrogen-containing silicon carbide.

6. The method of claim 1, wherein said first stress-inducing layer has an internal tensile stress level and said second transistor is a P-channel transistor.

7. The method of claim 6, wherein said second stress-inducing layer has an internal compressive stress level and said first transistor is an N-channel transistor.

8. The method of claim 1, wherein said first stress-inducing layer has an internal compressive stress level and said second transistor is an N-channel transistor.

9. The method of claim 8, wherein said second stress-inducing layer has an internal tensile stress level and said first transistor is a P-channel transistor.

10. The method of claim 1, wherein said size of the sidewall spacer structure of said second transistor is reduced while performing said etch sequence.

11. The method of claim 1, wherein reducing a size of the sidewall spacer structure of said second transistor comprises substantially completely removing at least one spacer element of said sidewall spacer structure.

12. The method of claim 1, comprising forming said dielectric layer stack by forming an etch stop layer and using said etch stop layer for controlling at least one etch process in said etch sequence.

13. The method of claim 12, wherein said etch stop layer is formed prior to forming said first stress-inducing layer.

14. The method of claim 12, wherein said etch stop layer has an internal compressive stress level.

15. The method of claim 14, wherein said etch stop layer is comprised of nitrogen-containing silicon carbide.

16. A method, comprising:
performing an etch sequence for selectively removing a portion of dielectric layer stack from above a first transistor while retaining a portion of the dielectric layer stack above a second transistor, said dielectric layer stack comprising a first stress-inducing layer and an etch control layer formed above said first stress-inducing layer;
reducing a size of a sidewall space structure formed on sidewalls of a gate electrode structure of the first transistor, said reducing being concurrent with forming recesses in metal silicide regions in the first transistor, while maintaining a sidewall space structure formed on sidewalls of a gate electrode structure of the second transistor;
forming a second stress-inducing layer above the reduced sidewall spacer structure and in the recesses of the first transistor.

17. The method of claim 16, wherein said first stress-inducing layer has an internal compressive stress level and said second transistor is a P-channel transistor.

18. The method of claim 17, wherein said second stress-inducing layer has an internal tensile stress level and said first transistor is an N-channel transistor.

19. The method of claim 16, wherein said first stress-inducing layer has an internal tensile stress level and said second transistor is an N-channel transistor.

20. The method of claim 19, wherein said second stress-inducing layer has an internal compressive stress level and said first transistor is a P-channel transistor.

21. The method of claim 16, wherein said size of the sidewall spacer structure of the first transistor is reduced while performing said etch sequence.

22. The method of claim 16, wherein reducing a size of the sidewall spacer structure of the first transistor comprises substantially completely removing at least one spacer element of the sidewall spacer structure.

* * * * *